(12) United States Patent
Minden et al.

(10) Patent No.: US 7,532,392 B1
(45) Date of Patent: May 12, 2009

(54) DARK CHANNEL ARRAY

(75) Inventors: Monica L. Minden, Calabasas, CA (US); Hans W. Bruesselbach, Calabasas, CA (US); Oleg M. Efimov, Thousand Oaks, CA (US); Shuoqin Wang, Westlake Village, CA (US); Daniel Yap, Newbury Park, CA (US)

(73) Assignee: HRL Laboratories, Malibu, CA (US)

( * ) Notice: Subject to any disclaimer, the term of this patent is extended or adjusted under 35 U.S.C. 154(b) by 69 days.

(21) Appl. No.: 11/392,140

(22) Filed: Mar. 29, 2006

(51) Int. Cl.
*H01S 5/00* (2006.01)
*H01S 3/00* (2006.01)

(52) U.S. Cl. ............... 359/344; 372/50.12; 372/50.123
(58) Field of Classification Search .............. 359/344; 372/50.12, 50.123
See application file for complete search history.

(56) References Cited

U.S. PATENT DOCUMENTS

| | | | | |
|---|---|---|---|---|
| 4,706,255 A | * | 11/1987 | Thornton et al. | 372/50.121 |
| 4,719,630 A | * | 1/1988 | Streifer | 372/18 |
| 4,719,632 A | * | 1/1988 | Lindsey et al. | 372/50.123 |
| 4,727,557 A | * | 2/1988 | Burnham et al. | 372/50.12 |
| 4,757,268 A | | 7/1988 | Abrams et al. | |
| 4,947,401 A | * | 8/1990 | Hinata et al. | 372/50.12 |
| 4,985,897 A | | 1/1991 | Botez et al. | |
| 5,027,359 A | | 6/1991 | Leger et al. | |
| 6,175,337 B1 | * | 1/2001 | Jasper et al. | 343/770 |

OTHER PUBLICATIONS

D.Heitmann, et al., Calculation and Experimental Verification of Two-Dimensional Focusing Grating Couplers, IEEE J. QE, 17, p. 1257 (1981).
E.Kapon, et al., Inverted-V chirped phased arrays of gain-guided GaAs/GaAlAs diode lasers, Appl. Phys. Lett., 45 (12) p. 1257 (1984).
Chen, et al., Spatial hole burning problems in evanescently coupled semiconductor laser arrays, Appl. Phys. Lett., 47 (6) p. 555 (1985).
L.J.Mawst, et al., numerous refs., for example Highly Coherent, In-Phase-Mode Operation of 20-Element Resonant Arrays of Antiguides, IEEE Phot. Tech. Lett. 2 (4) p. 249 (1990).
R.J. Noll, et al., Analysis of Grating Surface Emitting Lasers, IEEE J.QE. 26, p. 456 (1990).
R.M. Atkins, et al., Mechanisms of Enhanced UV Photosensitivity via Hydrogen Loading in Germanosilicate Glasses, Electron, Lett., 39, p. 1234 (1993).
Botez and Mawst, Phase-locked Laser Arrays Revisited, IEEE Circuits and Devices Magazine, vol. 12, (6) p. 25 (1996).
A.Mekis, et al., Two-dimensional photonic crystal couplers for unidirectional light output, Opt. Lett., 24, p. 942 (2000).
U. Shogo, et al., Wavelength-Selective Coupling Among Three Vertically Integrated Optical Waveguides by Grating Couplers, IEEE Phot. Tech. Lett. 13 (2) p. 133 (2001).
L.J. Mawst et al, Phase-Locked Array of Antiguided Lasers with Monolithic Spatial Filter, Electronics Letters, Mar. 2, 1989, pp. 365-366, vol. 25 No. 5.

* cited by examiner

*Primary Examiner*—Eric Bolda
(74) *Attorney, Agent, or Firm*—Balzan Intellectual Property Law, PC

(57) ABSTRACT

In one embodiment, a dark channel array is provided which includes gain channels, each gain channel being configured to emit an output beam, and which includes a dark channel configured to cause output beams from the gain channels to be coherently couple in phase with each other.

52 Claims, 11 Drawing Sheets

US 7,532,392 B1

DARK CHANNEL ARRAY

CROSS-REFERENCES TO RELATED APPLICATIONS

The subject matter of the present application is related to co-pending U.S. patent application Ser. No. 10/893,105, filed Jul. 15, 2004, entitled DARK FIBER LASER ARRAY COUPLER; co-pending U.S. patent application Ser. No. 10/893,106, filed Jul. 15, 2004, entitled DARK FIBER LASER ARRAY COUPLER; co-pending U.S. patent application Ser. No. 10/759,510 filed on Jan. 15, 2004, entitled METHOD AND APPARATUS FOR COHERENTLY COMBINING MULTIPLE LASER OSCILLATORS; and co-pending U.S. patent application Ser. No. 10/759,511 filed on Jan. 15, 2004, entitled METHOD AND APPARATUS FOR COMBINING LASER LIGHT; all of which are herein incorporated by reference in their entireties.

BACKGROUND

The power of individual semiconductors lasers is limited by bulk and surface material damage. Power scaling involves combining many diode lasers. The brightness of an array, however, is not as large as a single laser with the same power unless the emitters can be made coherent with each other.

Coherent coupling of diode arrays has long been approached by letting adjacent gain channels evanescently couple to each other and lock into a large effective spatial mode, sometimes dubbed a supermode. Because the inter-channel spaces are lossy, the lasers are encouraged to lock in an antiphase pattern, where the phase of alternate channels reverses in sign, and there are intensity nulls between channels. The emitted field with its modulated spatial phase propagates into the far field as a beam with more than one lobe. This weakens the goal of high brightness.

In one proposed diode laser array, the phase of each output beam is individually controlled with an electrical current such that the output beams are coherent in phase with each other. This method, however, requires electrical circuitry to actively control each diode laser in the array, which increases the cost and size of the array. Moreover, this method may also be difficult to scale to a large number of diodes.

In light of the above, there exists a need for a scalable system and method of coherently coupling output beams in phase with each other.

SUMMARY

A dark channel array addresses the need to coherently couple laser beams. The gain channels each emit an output beam, and the dark channel captures portions of the output beams to cause the output beams in the gain channels to coherently couple in phase. The number of gain channels in the dark channel array is scalable by positioning multiple dark channels among the gain channels.

In a possible embodiment, a dark channel array includes gain channels and a dark channel. Each of the gain channels is configured to emit an output beam. The dark channel is configured to capture a portion of the output beam emitted from at least one of the gain channels to cause the output beams to coherently couple in phase with each other.

In a possible embodiment, a dark channel array includes a semiconductor substrate, gain channels disposed on the semiconductor substrate, and a dark channel. Each of the gain channels is configured to emit an output beam. The dark channel is configured to cause the output beams to coherently couple with each other.

In some embodiments, a diode laser array includes a semiconductor substrate, diode lasers disposed on the semiconductor substrate, and a dark channel. Each of the diode lasers is configured to generate an output beam and emit the output beam. The dark channel is configured to cause the output beams to coherently couple with each other.

In one implementation, a method of coherently coupling output beams includes generating an output beam in each gain channel of a dark channel array. The method further includes coupling a portion of each output beam in at least one dark channel of the dark channel array to cause the output beams to coherently combine in phase with each other.

In one implementation, a method of coherently coupling output beams includes generating an output beam in each gain channel of a dark channel array. The method further includes creating an interferometric null in at least one dark channel of the dark channel array to cause the output beams to coherently couple with each other.

In one implementation, a dark channel array includes gain channels and dark channels interspersed in a two dimensional array. The gain channels are configured to emit output beams, and the dark channels are configured to capture a portion of the output beam coupled from at least one gain channel to cause the output beams to coherently couple in phase with each other.

BRIEF DESCRIPTION OF THE DRAWINGS

Further features and advantages of the invention may be more readily understood by reference to the following description taken in conjunction with the accompanying drawings.

DESCRIPTION

A dark channel array in accordance with various embodiments combines portions of independent output beams to cause the output beams to coherently couple in phase. The coherently coupled output beams may be combined to form a laser beam having a single lobe in a far field. This may be accomplished with a two-dimensional dark channel array, and in some possible embodiments, with a one-dimensional dark channel array.

One-Dimensional Array (FIGS. 1-8)

Figure 1:
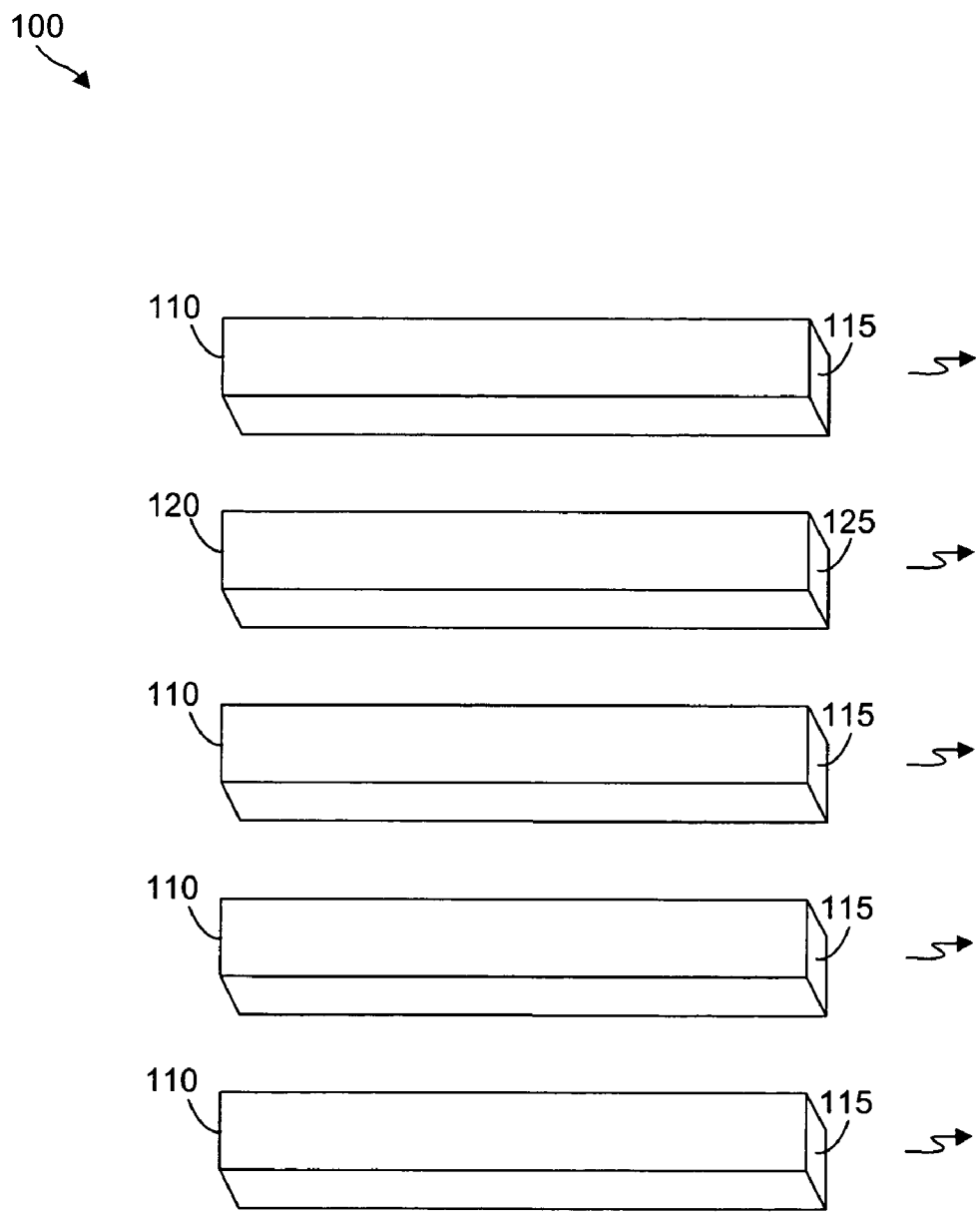
FIG. 1 is a schematic diagram of a possible embodiment of a dark channel array.

FIG. 1 illustrates a schematic diagram of a possible embodiment of a dark channel array 100. The Dark Channel array 100 includes gain channels 110 and a dark channel 120. Each of the gain channels 110 emits an output beam from an end 115, which combine in phase into a laser beam emitted from the dark channel array 100. In addition to the output beams emitted from the end 115 of each gain channel 110, the dark channel 120 may also emit an output beam from an end 125. Portions of the output beams cross-couple into other gain channels 110 and into the dark channel 120. In this embodiment, the output beams are formed in the gain and dark channels 110 and 120, and exit the gain and dark channels 110 and 120 as indicated by the arrows adjacent the ends 115 and 125. Thus, as discussed herein, the term "output beam" is considered to include the laser energy within the gain and dark channels 110 and 120 prior to exiting the gain and dark channels 110 and 120. In addition, the term includes the laser energy after exiting the gain and dark channels 110 and 120.

In various possible embodiments, the gain channels 110 have similar physical characteristics. As is described more fully herein, the dark channel 120 has at least one physical characteristic that differs from those of the gain channels 110. The different physical characteristic of the dark channel 120 enables the dark channel 120 to cause the output beams emitted from the ends 115 of the gain channels 110 to coherently couple in phase with each other. With the output beams of all the gain channels 110 and the dark channel 120 in phase, the intensity of the total output beam emitted from the dark channel array 100 is substantially the square of the sum of the square roots of the peak intensities of the output beams emitted from the ends 115 of the gain channels 110 and the end 125 of the dark channel 120. In some embodiments, the dark channel array 100 may be fabricated on or in a semiconductor substrate.

Figure 2:
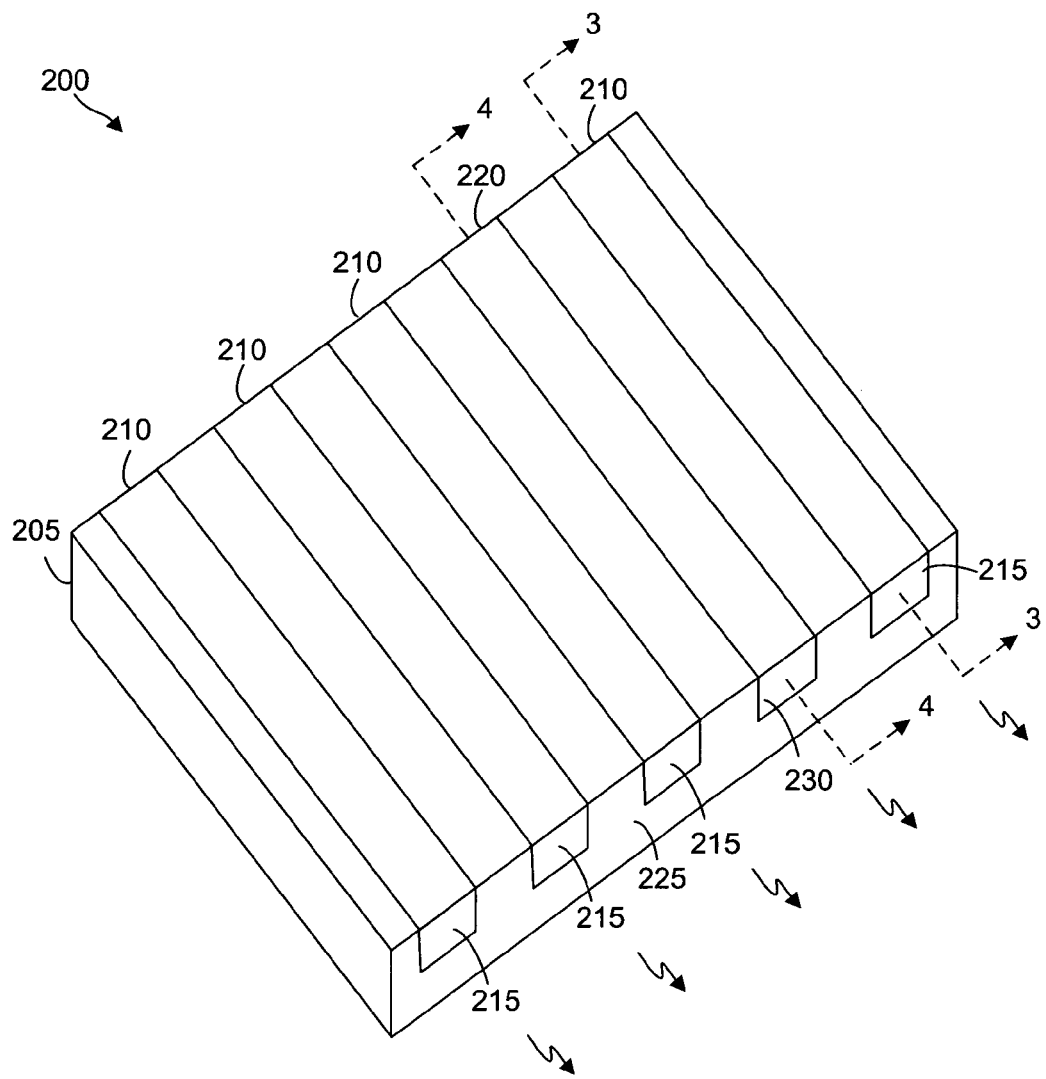
FIG. 2 is a perspective view of another possible embodiment of the dark channel array.

FIG. 2 illustrates a perspective view of a possible embodiment of a dark channel array 200 in a semiconductor substrate 205. The dark channel array 200 includes an array of the gain channels 210 and a dark channel 220. The channels 210 and 220 may be evenly spaced apart with the dark channel 220 located between two of the gain channels 210. For example, two of the gain channels 210 may be spaced apart from each other by a distance, and any two of the gain channels 210 may be spaced apart from each other by a positive integer multiple of the distance. The dark channel 220 may be spaced apart from two of the gain channels 210 by the distance or may be offset closer to one of the gain channels 210. The gain channels 210 and the dark channel 220 may be substantially coplanar, substantially parallel to each other, or both.

Each of the gain channels 210 generates an output beam and emits the output beam from an end 215 on a face 225 of the semiconductor substrate 205. Additionally, the dark channel 220 generates an output beam and emits the output beam from an end 230 on the face 225 of the semiconductor substrate 205. The output beams emitted from the ends 215 and 230 are collimated beams of light that are substantially parallel to each other such that the output beams converge in a far field. In this way, the output beams combine to form an in-phase coherently combined laser beam substantially having a single lobe in the far field.

The arrangement and physical characteristics of the gain channels 210 and the dark channel 220 are selected such that the dark channel 220 combines portions of the output beams to cause the output beams to coherently couple with each other. In this way, the output beams are coupled in phase at the ends 215 and 230 such that the output beams have in phase peak light intensities in the given gain channel 210. The dark channel 220 may establish a self-organizing condition among the gain channels 210 to substantially cause coherent coupling of the output beams emitted from the ends 215. Coherently coupling the output beams increases the light intensity of the laser beam in the far field and results substantially in a single lobe pattern of the laser beam in the far field.

In one possible embodiment, the dimensions of the dark channel 220 are different than those of the gain channels 210. For example, the height, width, or length of the dark channel 220, or any combination thereof, may be different from the corresponding height, width, or length of one of the gain channels 210. In another possible embodiment, the dark channel 220 and the gain channels 210 have the same physical dimensions, but the dark channel 220 has a different refraction index or a different wave propagation rate than that of the gain channels 210.

Although the dark channel array 200 of FIG. 2 is shown having four gain channels 210 and only one dark channel 220, the dark channel array 200 may include any number of gain channels 210 and more than one dark channel 220 interspersed among the gain channels 210. The gain channels 210 and the dark channel 220 may be oriented horizontally, vertically, or diagonally in the semiconductor substrate 205. Furthermore, as shown in the embodiment if FIG. 2, the dark channel 220 may be positioned within the dark channel array 200 so that the dark channel array 200 is asymmetric with regard to the location of the dark channel 220.

Figure 3:
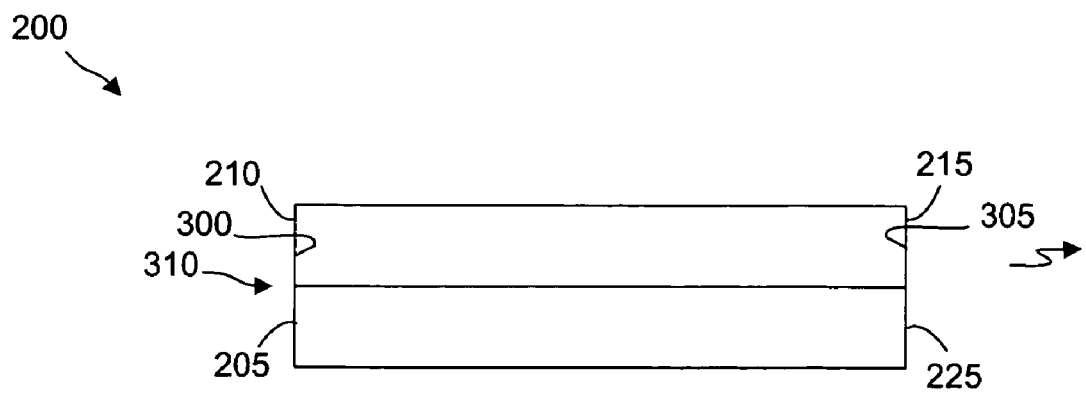
FIG. 3 is a cross-sectional view of the dark channel array of FIG. 2 along the line 3-3.

FIG. 3 illustrates a cross-sectional view of the dark channel array 200 of FIG. 2 taken along the line 3-3 shown in FIG. 2. As shown in FIG. 3, in one possible embodiment the gain channel 210 has a reflector 300 at one end and a partial reflector 305 at an opposing end. The reflector 300 may include a mirrored surface, and the partial reflector 305 may include a partially mirrored surface or a wave splitter. The semiconductor substrate 205 may be cleaved to create the face 225, and the face 225 may then be polished and/or coated to create the partial reflector 305. The gain channel 210 has a refraction index that is higher than a refraction index of the semiconductor substrate 205 and functions as a waveguide for the output beam propagating between the reflector 300 and the partial reflector 305.

In one possible embodiment, each of the gain channels 210 together with a portion of the semiconductor substrate 205 forms a laser diode 310 having a p-n junction at an interface between the gain channel 210 and the semiconductor substrate 205. For example, the gain channel 210 may be an n-type gallium arsenide material and the semiconductor substrate 205 may be a p-type gallium arsenide material. The gain channel 210 may be formed on the semiconductor substrate 205 by depositing an n-type semiconductor material on the semiconductor substrate 205.

Alternatively, the gain channel 210 may be formed on the semiconductor substrate 205 by doping a portion of a p-type semiconductor material with an n-type impurity to form the gain channel 210 on a layer of the semiconductor substrate 205. In response to an electrical current passing through the gain channel 210 and the semiconductor substrate 205 of a given laser diode, the laser diode generates light waves in the gain channel 210. Other embodiments are possible.

Figure 4:
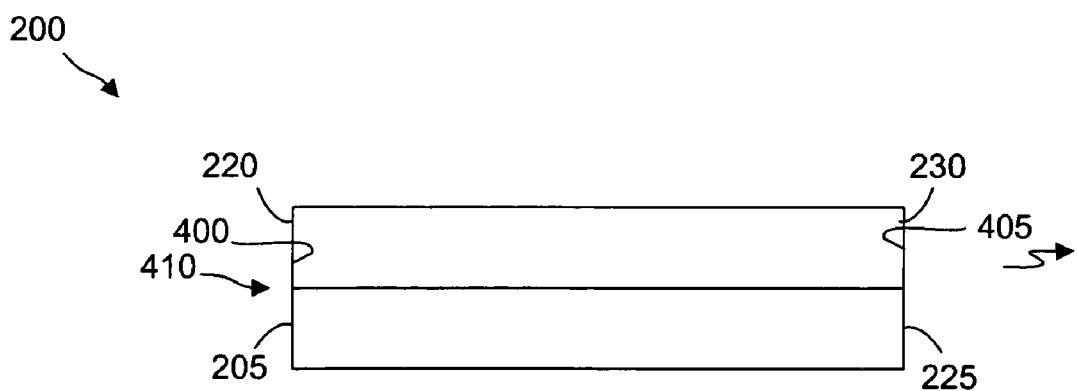
FIG. 4 is a cross-sectional view of the dark channel array of FIG. 2 along the line 4-4.

FIG. 4 illustrates a cross-sectional view of the dark channel array 200 of FIG. 2 taken along the line 4-4 in FIG. 2. As shown in FIG. 4, the dark channel 220 has a refraction index that is higher than the refraction index of the semiconductor substrate 205 and functions as a waveguide for coupling the portions of the output beams received from the gain channels 210 (FIG. 2). The gain channels 210 and the dark channel 220 each cross-couple to portions of the output beams from other gain channels 210 or the dark channel 220 in such a way that it creates a null light intensity in the dark channel 220 when all of the output beams are in phase. The dark channel 220 may combine the portions of output beams by evanescent coupling between the channels 220 and 210. In other possible embodiments discussed further below, the output beams couple by radiation mode coupling.

In one possible embodiment, the dark channel 220 has an optional reflector 400 at one end and a partial reflector 405 at an opposing end. The reflector 400 receives light waves and reflects the light waves toward the partial reflector 405. The partial reflector 405 receives light waves, passes a portion of the light waves, and reflects a portion of the light waves toward the reflector 400. The light intensity of the portion of the light waves emitted from the dark channel 220 may be substantially the same as the intensity of the light waves emitted from each end 215 of the gain channels 210 (FIG. 2). In contrast to the gain channels 210, the light waves propagating in the dark channel 220 combine to substantially create a null light intensity at the reflector 400 of the dark channel 220. Moreover, the light intensity emitted from the end of the dark channel 220 at the optional reflector 400 is substantially null when the output beams are in phase at the ends 215 and 230. In other possible embodiments, the reflector 400 is absent, or is a partial reflector.

In another possible embodiment, the dark channel 220 in combination with the semiconductor substrate 205 forms a diode laser 410. The dark channel 220 is pumped to transparency by limiting the current passing through the diode laser 410. Pumping the dark channel 220 to transparency allows the portions of the output beams to propagate through the dark channel 220 and to combine in the dark channel 220. In an alternative embodiment, the diode laser 410 is inactive near the reflector 400 and the portions of the output beams received in the dark channel 220 are captured in the dark channel 220.

Referring again to FIG. 2, the arrangement and physical characteristics of the semiconductor substrate 205, the gain channels 210, and the dark channel 220 may be determined by creating an optical model of the dark channel array 200, and using a reciprocity method to create an interferometric null in the dark channel 220 of the optical model. The optical model of the dark channel array 200 may be modeled by using a commercial waveguide simulator such as BeamPROP, which is available from RSoft Design Group, Inc. of Ossining, N.Y. The dark channel array 200 is modeled as a gain structure including the gain channels 210 and the dark channel 220. The arrangement and physical characteristics of the semiconductor substrate 205, the gain channels 210, and the dark channel 220 are represented by coupling coefficients in the optical model.

In the reciprocity method, a wave having a flat uniform wavefront is modeled to propagate into the gain channels 210 of the optical model through the ends 215 of the gain channels 210 and the end 230 of the dark channel 220. Portions of the modeled wave propagate to the reflector 400 of the dark channel 220 of the optical model and interferometrically combine in the dark channel 220 to form an interferometric wave. If the interferometric wave in the dark channel 220 is null, the coupling coefficients are selected to determine the arrangement and physical characteristics of the semiconductor substrate 205, the gain channels 210, and the dark channel 220 of the dark channel array 200. If the interferometric wave is not null in the dark channel 220, one or more of the coupling coefficients is modified until the interferometric wave in the dark channel 220 of the optical model is null. The coupling coefficient are then selected to determine the arrangement and physical characteristics of the semiconductor substrate 205, the gain channels 210, and the dark channel 220 of the dark channel array 200.

The coupling coefficients may be selected in the optical model so that the portions of the output beam from the gain channels 210 will combine to substantially create a null light intensity in the dark channel 220 and cause the output beams to coherently combine at the ends 215 of the gain channels 210 and the end 230 of the dark channel 230. The coupling coefficients may be selected based on the arrangement of the gain channels 210 and the dark channel 220. For example, the coupling coefficients may be selected such that the gain channels 210 are parallel to each other or that the dark channel 220 is parallel to the gain channels 210. The coupling coefficients may be selected such that the gain channels 210 are coplanar with each other or that the dark channel 220 is coplanar with the gain channels 210.

The coupling coefficients may be based on physical dimensions of the gain channels 210 and the dark channel 220, such as heights, widths, and lengths, distances between the gain channels 210, and/or distances between the dark channel 220 and the gain channels 210. Further, the coupling coefficients may be based on the refraction indexes of the semiconductor substrate 205, the gain channels 210, and/or the dark channel 220. The coupling coefficients may also be based on wave propagation rates in the semiconductor substrate 205, the gain channels 210, and the dark channel 220.

Figure 5:
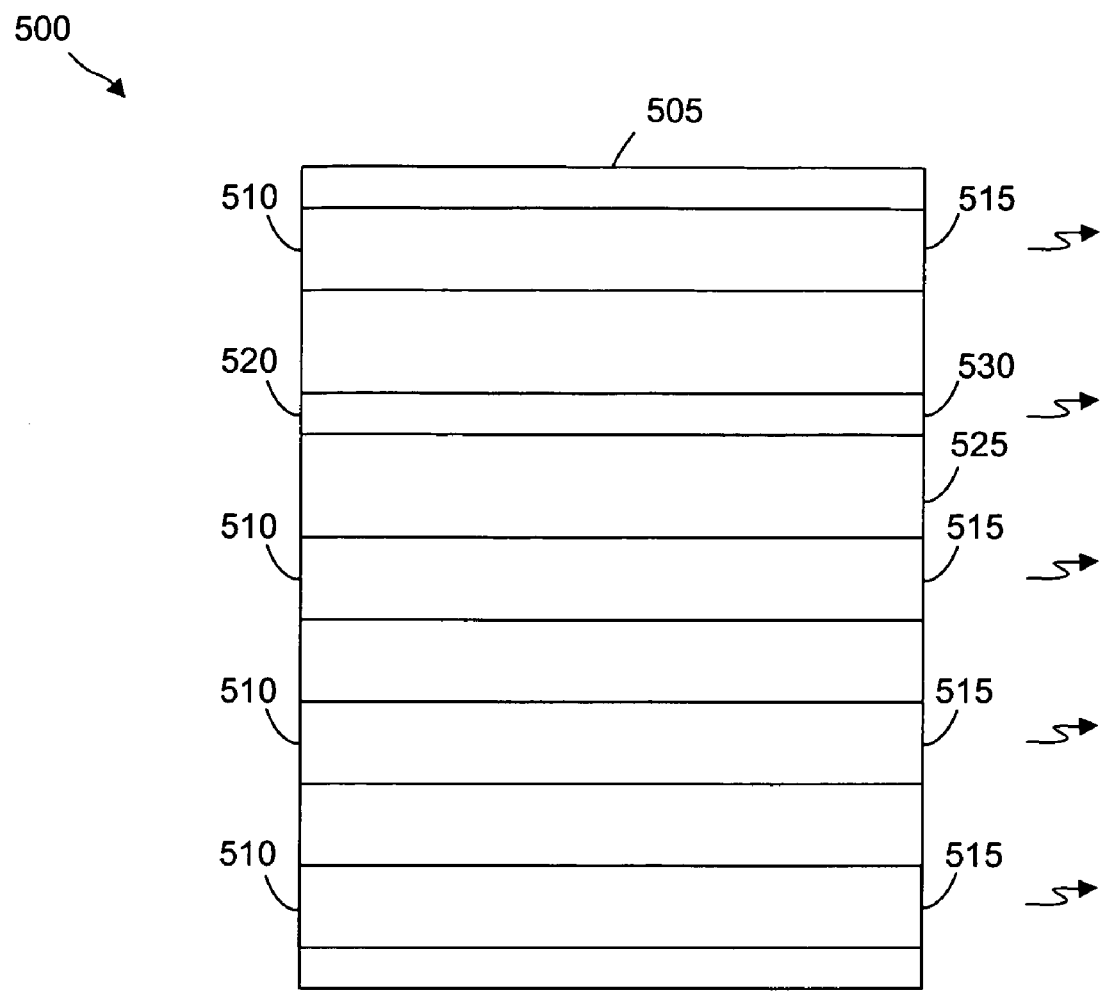
FIG. 5 is a top view of a possible embodiment of the dark channel array.

FIG. 5 illustrates a top view of a possible embodiment of a dark channel array 500. The dark channel array 500 includes gain channels 510 and a dark channel 520 on a semiconductor substrate 505. Each of the gain channels 510 includes an end 515 on a face 525 of the semiconductor substrate 505. In addition, the dark channel 520 includes an end 530 on the face 525 of the semiconductor substrate. In this embodiment, the width of the dark channel 520 is less than the width of the gain channels 510. Each of the gain channels 510 and the dark channel 520 emits an output beam from the respective ends 515 and 530.

Figure 6:
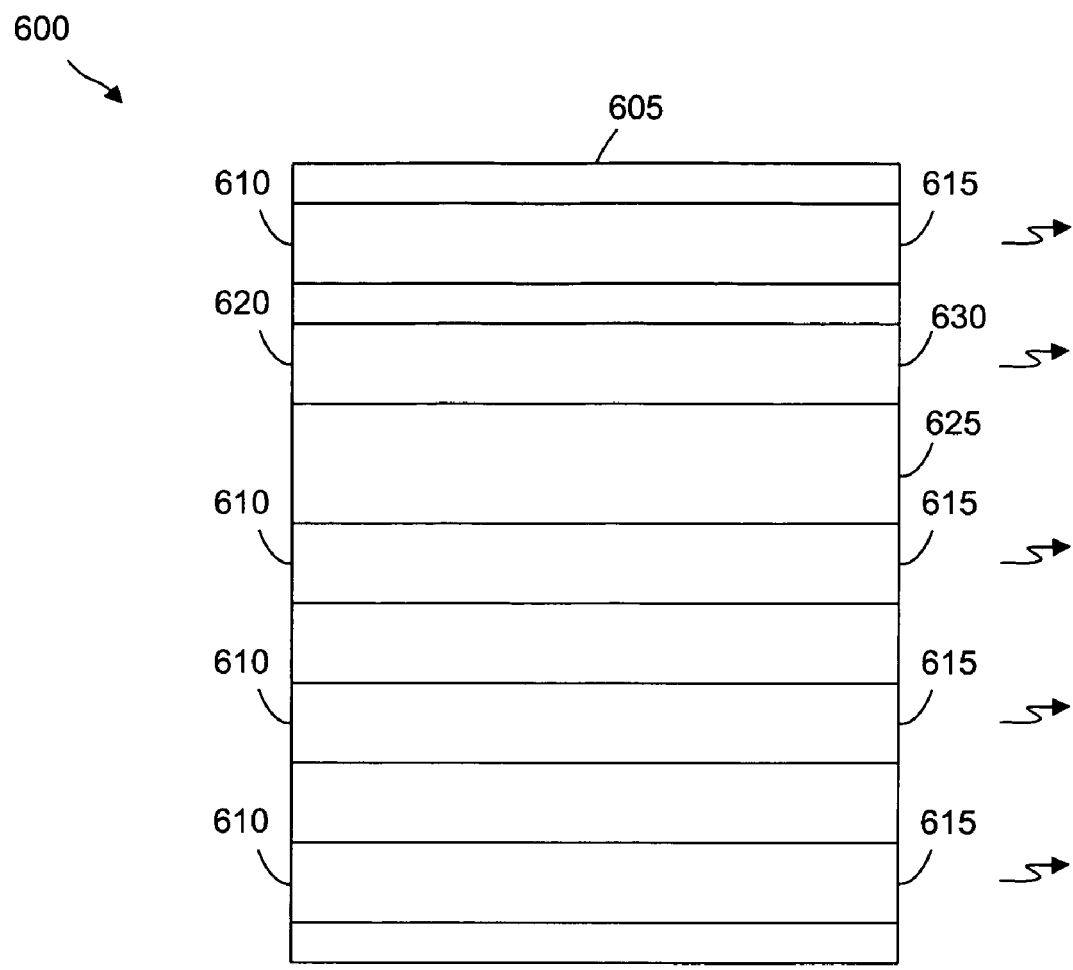
FIG. 6 is a top view of a possible embodiment of the dark channel array.

FIG. 6 illustrates a top view of a possible embodiment of a dark channel array 600. The dark channel array 600 includes gain channels 610 and a dark channel 620 on a semiconductor substrate 605. Each of the gain channels 610 includes an end 615 on a face 625 of the semiconductor substrate 605. In addition, the dark channel 620 includes an end 630 on the semiconductor substrate 605 near the ends 615 of the gain channels 610. In this embodiment, the dark channel 620 is offset from one of the gain channels 610. Each of the gain channels 610 and the dark channel 620 emits an output beam from the respective ends 615 and 630.

Figure 7:
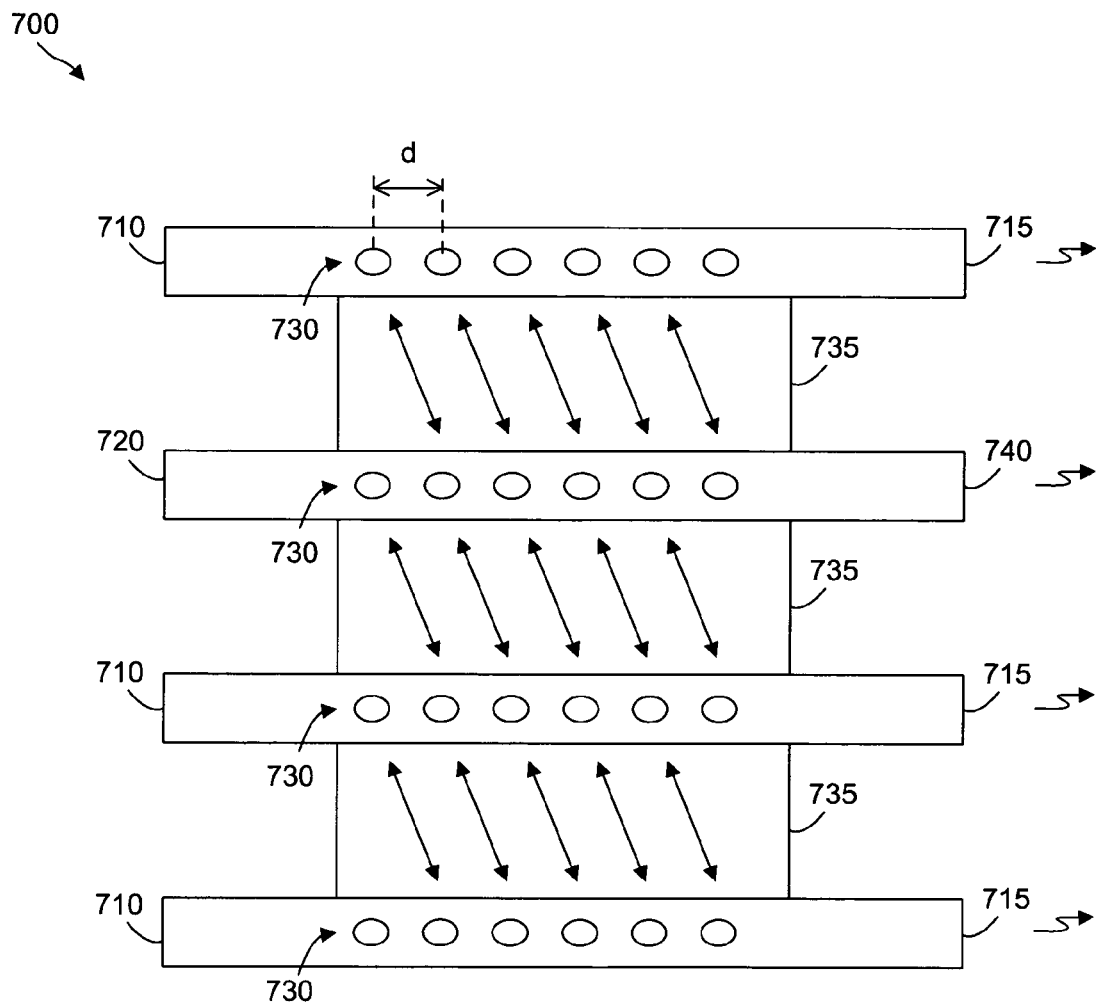
FIG. 7 is a cut away top view schematic diagram of a possible embodiment of the dark channel.

FIG. 7 illustrates a cut away top schematic view of possible embodiment of a dark channel array 700. The dark channel array 700 includes gain channels 710 and a dark channel 720. Each of the gain channels 710 emits an output beam from an end 715, and the dark channel 720 emits an output beam from an end 740. The dark channel array 700 includes coupling regions 735 located between the gain channels 710 or the dark channel 720. The gain channels 710 each include scattering centers 730 that scatter a portion of the output beam from the gain channel 710 to one or more adjacent coupling regions 735. Additionally, the dark channel 720 may include scattering centers 730 that scatter a portion of the output beam from the dark channel 720 to one or more adjacent coupling regions 735. Each of the coupling regions 735 radiantly couples the scattered portions of the output beams received in the coupling region 735, which may improve the coupling efficiency between the output beams. Moreover, the effective refractive index of the coupling region 735 may be selected such that the scattered portions of the output beam combines in phase. For example, the material of the coupling region 735 may be selected such that the Bragg condition is satisfied.

In some possible embodiments, the coupling coefficients of the dark channel array 700 associated with radiant coupling may be more stable than the coupling coefficients associated with evanescent coupling, which may improve operation of the dark channel array 700. For example, the effective index of the coupling region 735 may be more stable than an effective index of a semiconductor substrate over a temperature range. The effective index of the coupling region 735 may also be more stable than the effective index of a semiconductor substrate should nonlinear light effects occur between the gain channels 710. The scattering centers 730 may be surface gratings, relief gratings, index modulation gratings, or photonic crystal structures.

In one possible embodiment, the scattering centers 730 of a gain channel 710 are spaced apart by a distance d, which is equal to the wavelength of the output beam emitted from the gain channel 710. Spacing the scattering centers 730 apart by the wavelength of the output beam causes a second order light scattering in the gain channels 710 such that the output beam travels primarily along a waveguide of the gain channel. For example, the coupling regions 735 may be grating couplers described by Shogo Ura, et al. in "Wavelength Selective Coupling Among Three Vertically Integrated Optical Waveguides by Grating Couplers," IEEE Photonics Technology Letters, Vol. 13, No. 2, pp. 133-35 (February 2001), which is hereby incorporated by reference.

Figure 8:
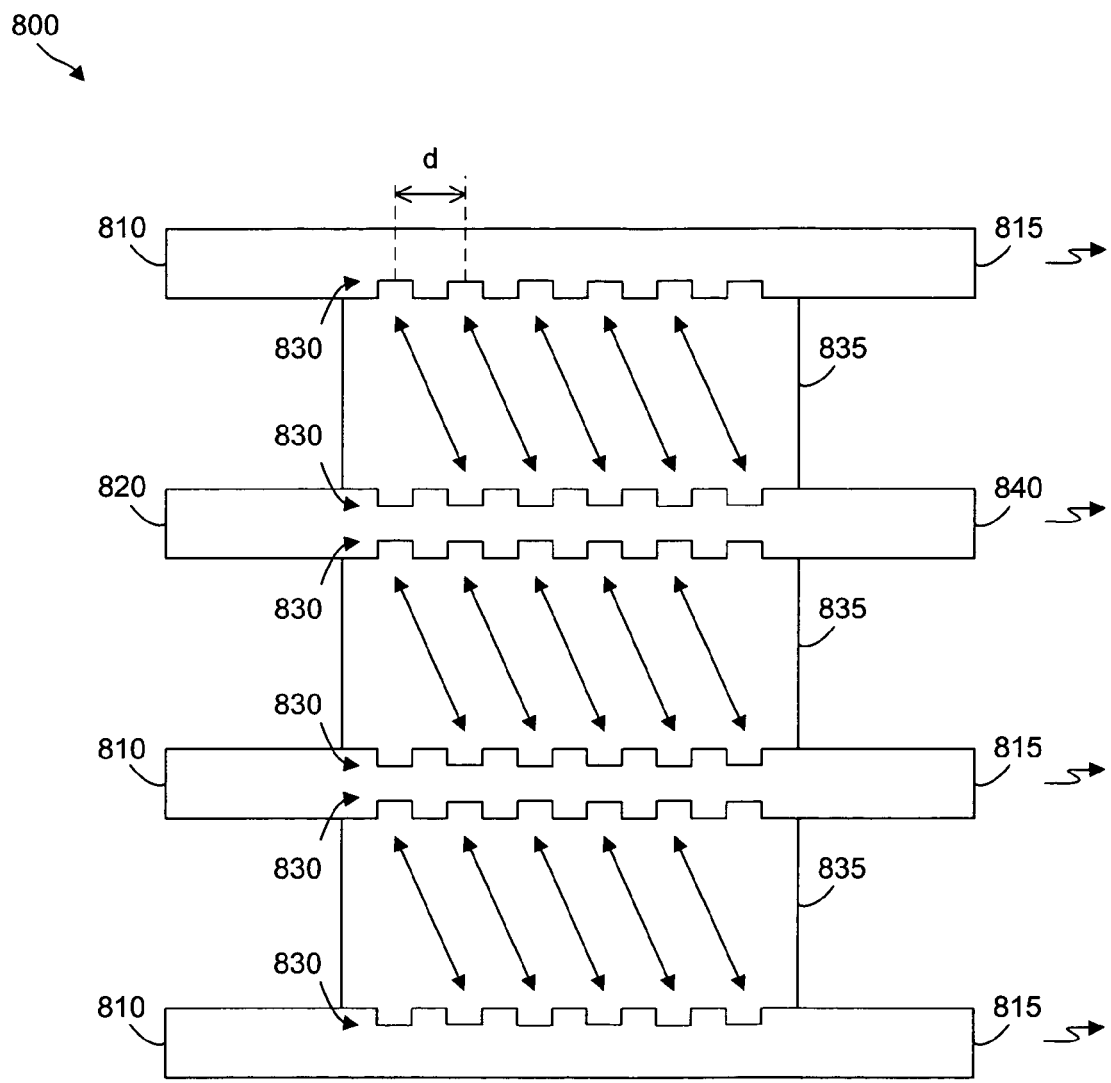
FIG. 8 is a cut away top view schematic diagram of a possible embodiment of the dark channel array.

FIG. 8 illustrates a cut away top view schematic view of a dark channel array 800 in accordance with another possible embodiment of the present invention. The dark channel array 800 includes gain channels 810 and a dark channel 820. Each of the gain channels 810 emits an output beam from an end 815, and the dark channel emits an output beam from an end 840. The dark channel array 800 includes coupling regions 835 located between the channels 810 and 820. In this embodiment, the coupling region 835 is a surface grating which includes scattering centers 830 that extend into one or more adjacent channels 810 or 820. The scattering centers 830 of the coupling region 835 scatter a portion the output beams from adjacent channels 810 or 820 into coupling regions 835, and the coupling region 835 radiantly couples the scattered portions of the output beams.

Figure 9:
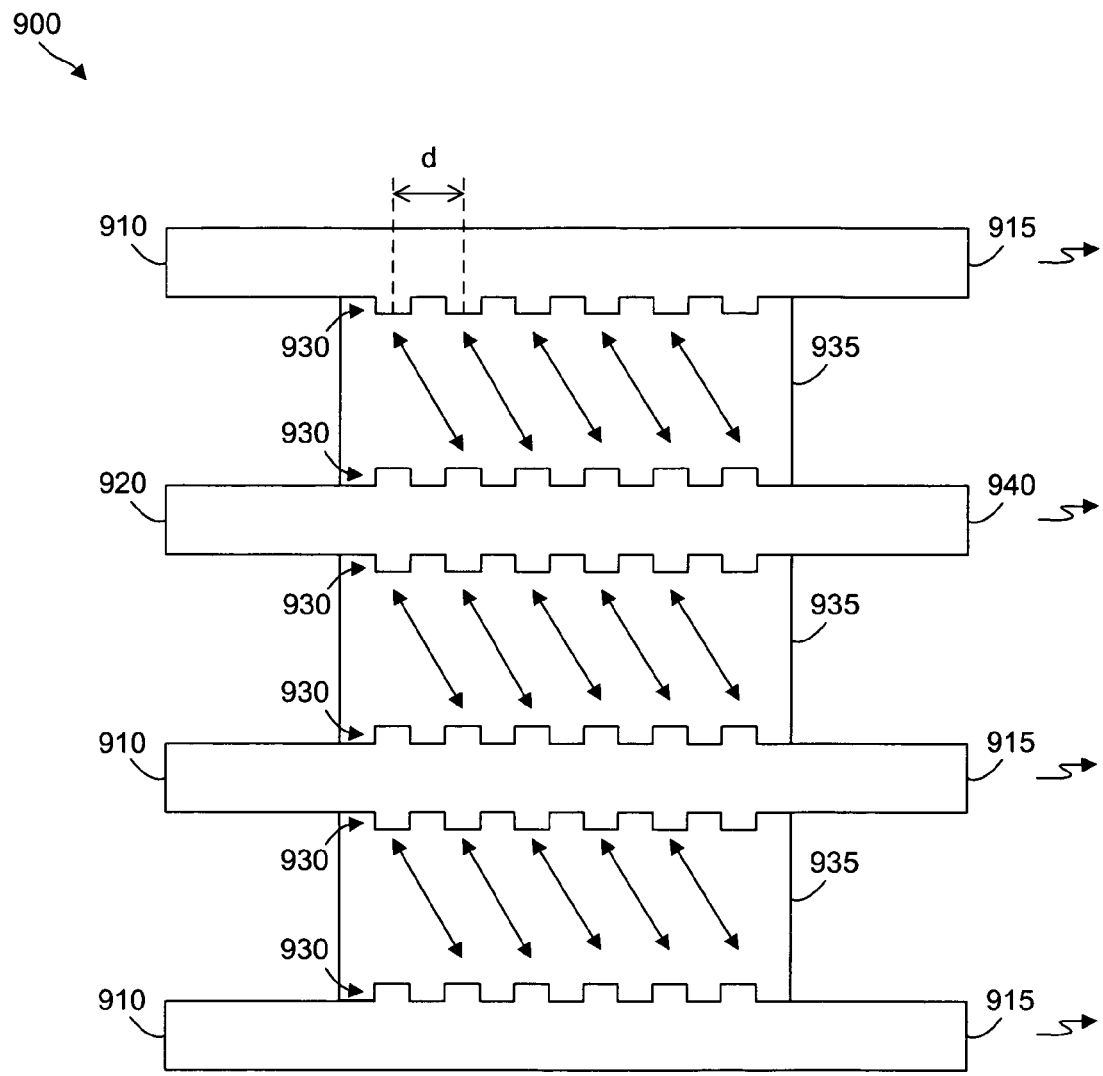
FIG. 9 is a cut away top view schematic diagram of a possible embodiment of the dark channel array.

FIG. 9 illustrates a cut away top view schematic diagram of a dark channel array 900 in accordance with another possible embodiment of the present invention. The dark channel array 900 includes gain channels 910 and a dark channel 920. Each of the gain channels 910 emits an output beam from an end 915, and the dark channel 920 emits an output beam from an end 940. The dark channel array 900 includes coupling regions 935 located between the channels 910 and 920. In this embodiment, the coupling region 935 is a relief grating which includes scattering centers 930. The scattering centers 930 of the coupling region 935 scatter portions of the output beams from adjacent channels 910 or 920 into the coupling region 935, and the coupling region 935 radiantly couples the scattered portions of the output beams.

Figure 10:
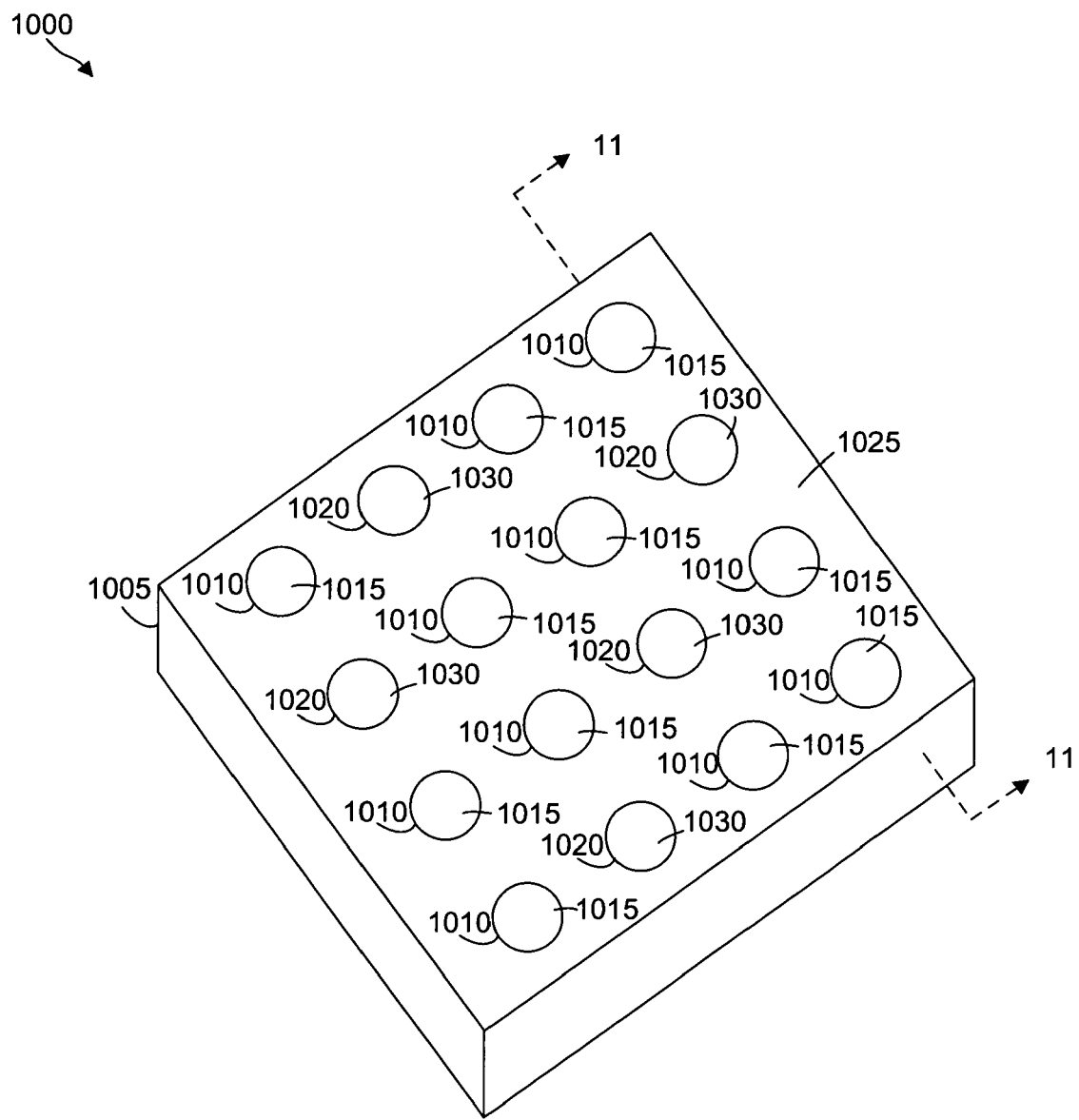
FIG. 10 is a perspective view of an embodiment of the dark channel array.
Figure 11:
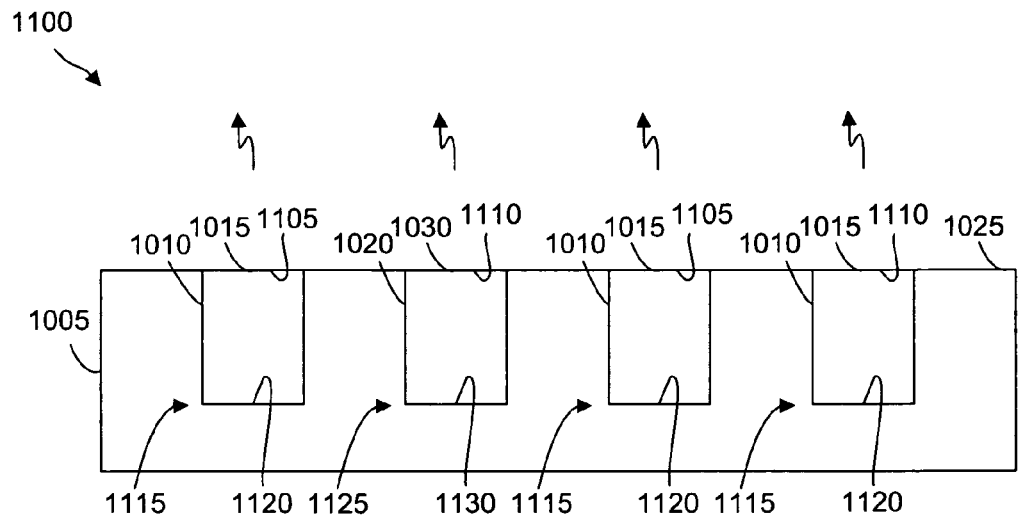
FIG. 11 is a cross-sectional side view of the embodiment of the dark channel array of FIG. 10 along the line 11-11.
Figure 12:
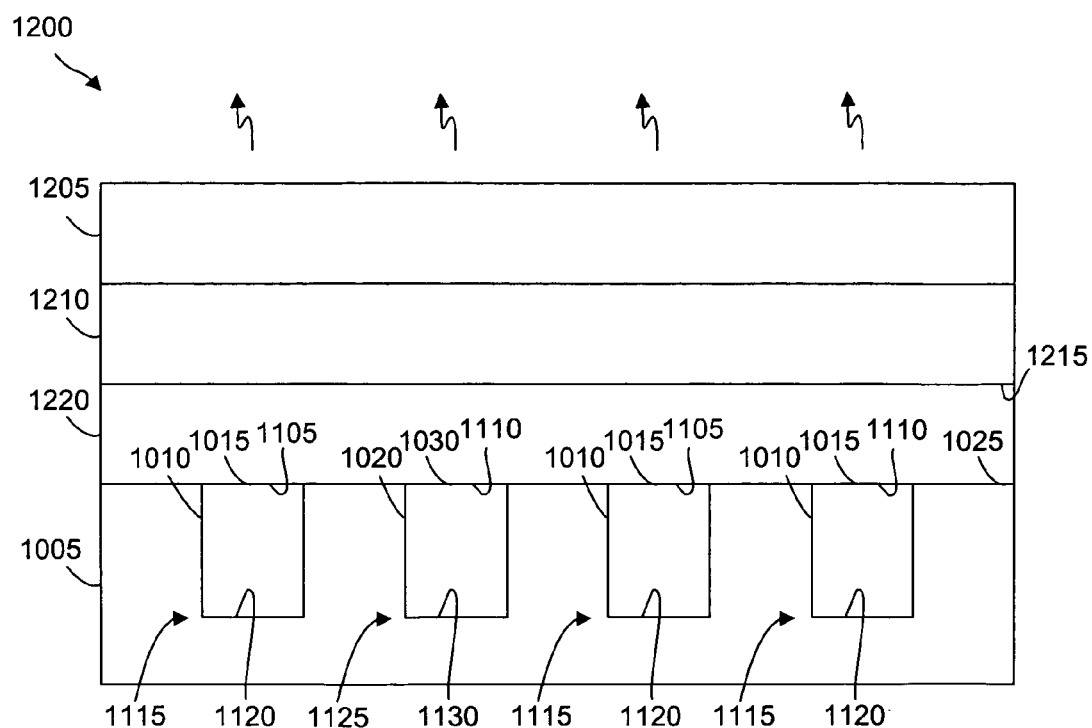
FIG. 12 is a cross-sectional side view of an embodiment of the dark channel array.

Two-Dimensional Array (FIGS. 10-12)

FIG. 10 illustrates a perspective view of an embodiment of a dark channel array 1000. The Dark Channel array 1000 includes gain channels 1010 arranged in a two-dimensional array with dark channels 1020 interspersed among the gain channels 1010. As shown in FIG. 10, each of the gain channels 1010 emits an output beam from an end 1015 located on a face 1025 of a semiconductor substrate 1005. In addition, each of the dark channels 1020 emits an output beam from an end 1030 located on the face 1025 of the semiconductor substrate 1005. The ends 1015 and 1030 may be substantially circular-shaped, and the face 1025 may be a top surface of the semiconductor substrate 1005. In various embodiments, the dark channel array 1000 may include a volume grating (not shown in FIG. 10), an output coupler (not shown in FIG. 10), or an aperture filler (not shown in FIG. 10), or any combination thereof, located adjacent to the face 1025 or to each other, as is discussed below in connection with FIG. 12.

The dark channel array 1000 of FIG. 10 may be modeled by using the reciprocity method as is described more fully herein. The dark channel array 1000 may also be modeled by using a programming language such as Solver, which is available from Frontline Systems Inc. of Incline Village, Nev. For example, the dark channel array 1000 may be modeled as a two-dimensional matrix, which represents coupling coefficients of the gain channels 1010 and the dark channels 1020 in the dark channel array 1000. Initial conditions are supplied to the model, and the matrix is solved by using Solver, such that interferometric nulls occur in the dark channels 1020 of the matrix. Moreover, solving such a model may indicate whether the dark channel array 1000 has a single stable mode.

The dark channels 1020 may be positioned within the dark channel array 1000 so that the dark channel array 1000 is asymmetric with regard to the location of the dark channels 1020.

FIG. 11 illustrates a cross-sectional side view of an embodiment of a dark channel array 1100 taken along the line 11-11 in FIG. 10. As shown in FIG. 11, each gain channel 1010 includes a reflector 1120 on the semiconductor substrate 1005 and a partial reflector 1105 on the face 1025 of the semiconductor substrate 1005. For example, the gain channel 1010 in combination with the semiconductor substrate 1005 may form a vertical laser diode gain component 1115, and the reflector 1120 may be a material in a vertical cavity of the vertical laser diode gain component 1115. The dark channel 1020 may include a reflector 1130 on the semiconductor substrate 1005 and a partial reflector 1110 on the face 1025 of the semiconductor substrate 1005. The dark channel 1010 in combination with the semiconductor substrate 1005 may form a vertical laser diode gain component 1125 capable of being pumped to transparency. Each of the gain channels 1010 emits an output beam from the end 1015 of the gain channel 1010 and couples a portion of the output beam to at least one adjacent channel 1010 or 1020. In some embodiments, the dark channel 1020 also emits an output beam from the end 1030 of the dark channel 1020. It receives a portion of the output beam from at least some of the gain channels 1010, for example by evanescent coupling. In this embodiment, an interferometic null occurs at the reflector 1130 of the dark channel 1020 when the outbeams emitted from the ends 1015 and 1030 are coupled in phase with each other.

FIG. 12 illustrates a cross-sectional side view of an embodiment of a dark channel array 1200. In one embodiment, the dark channel array 1200 includes a volume grating 1220, which may be adjacent the face 1025 of the semiconductor substrate 1005. The volume grating 1220 is constructed to allow coupling between portions of the output beams emitted from the gain channels 1010 and with the dark channel 1020. For example, the volume grating 1220 may be a holographic coupler constructed of glass. The volume grating 1220 may be composed of photo-thermo-refractive glass. For example, the volume grating 1220 may be a sodium-zinc-aluminum-silicate glass doped with cerium, silver, and fluorine, such as Corning 8702 available from Corning, Inc., located in Corning, N.Y.

Coupling the portions of the output beams in the volume grating 1220 instead of a semiconductor may improve the operation of the dark channel array 1200 because coupling characteristics of the volume grating may be less sensitive to temperature changes than coupling characteristics of the semiconductor. Moreover, the volume grating 1220 may function as the partial reflectors 1105 and 1110 for the respective channels 1010 and 1020.

Further, the dark channel array 1200 includes an output coupler 1210, which may be adjacent the volume grating 1220. The output coupler 1210 couples portions of the output beams passed through the volume grating 1220. For example, the output coupler 1210 may be a Bragg reflector. The output coupler 1210 may include a partially reflective surface 1215 that functions as the partial reflectors for the channels 1010 and 1020. The laser diode gain components 1115 or 1125 in combination with the surface 1215 are external cavity lasers. In this way, the gain channels 1010 and the dark channel 1020 extend to the surface 1215. For example, the laser diodes gain components 1115 may be Vertical Cavity Surface Emitting Lasers (VCSEL) or Novalux Extended Cavity Surface Emitting Lasers (NESCEL) available from Novalux, Inc. of Sunnyvale, Calif. Alternatively, the laser diodes gain components 1115 or 1125 may be edge emitting laser diodes available from nLight Photonics, Inc. of Vancouver, Wash., or edge emitting laser diodes available from Alfalight, Inc. of Madison, Wis.

In still a further embodiment, the dark channel array 1200 may include an aperture filler 1205, which may be adjacent the volume grating 1220 or the output coupler 1210. The aperture filler 1205 fills the exit apertures of the output beams emitted from the gain channels 1010. For example, the aperture filler 1205 may be a beam expander that expands the widths of the output beams emitted from the gain channels 1010. Additionally, the aperture filler 1205 may collimate the expanded output beams such that an output beam emitted from the dark channel array 1200 is substantially a single lobe in a far field. The aperture filler 1205 may be a photo-thermal-reflective glass and may be modeled by using a commercial waveguide simulator such as BeamPROP.

Figure 13:
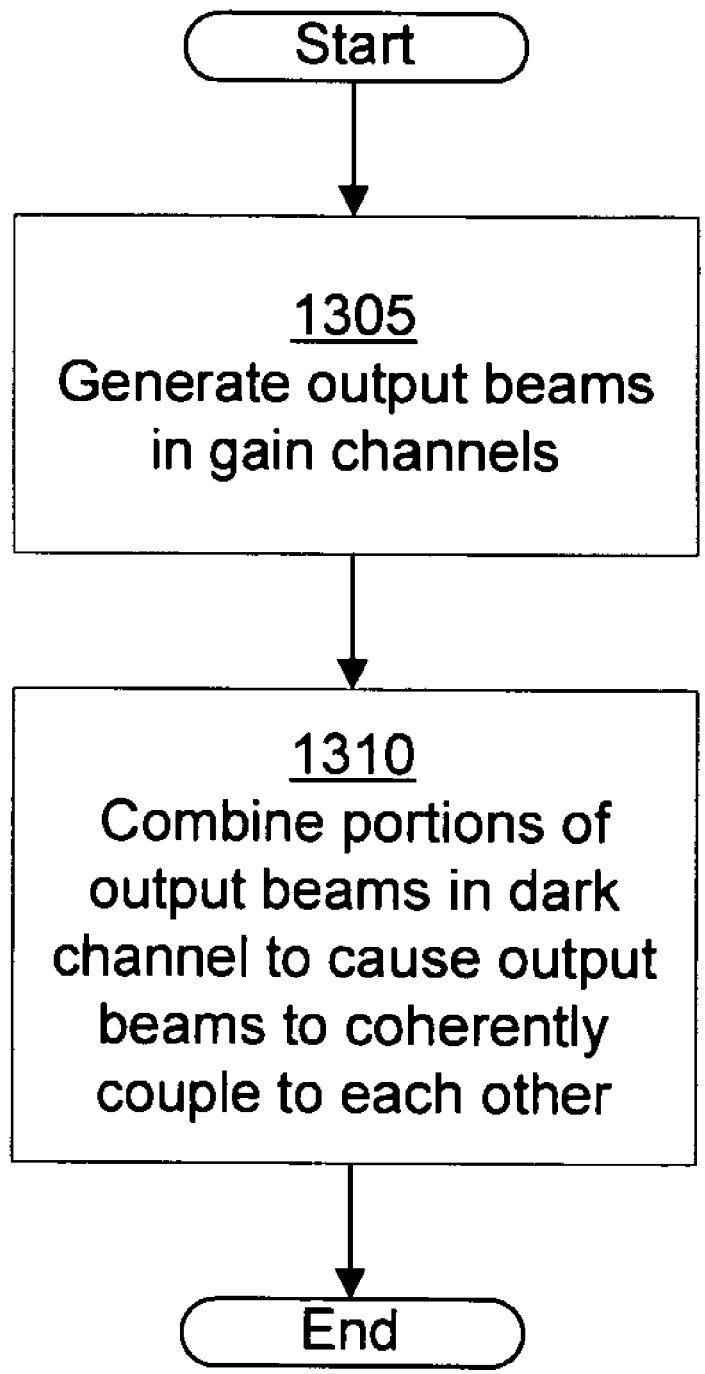
FIG. 13 is a flow chart of a possible implementation of a method for coherently coupling coherent waves.

FIG. 13 illustrates a flow chart of an implementation for coherently coupling coherent waves. In step 1305, the gain channels (e.g., gain channels 110, 210, 510, 610, 710, 810, 910 or 1010) and the dark channel(s) (e.g., dark channel 120, 220, 520, 620, 720, 820, 920 or 1020) emit output beams that couple into adjacent gain channels or dark channel(s). Each of the gain channels emits one of the output beams from an end (e.g., end 115, 215, 515, 615, 715, 815, 915 or 1015), and each of the dark channel(s) emit one of the output beams from an end (e.g., end 125, 230, 530, 630, 740, 840, 940 or 1030).

In step 1310, the dark channel captures the portions of the output beams to substantially create a null light intensity in the dark channel. In various embodiments, the dark channel(s) emit(s) the output beam at one end (e.g., end 125, 230, 530, 630, 740, 840, 940 or 1030) of the dark channel(s) and create(s) an interferometric null at an opposing end of the dark channel(s). For example, the dark channel may create an interferometric null at the reflector (e.g., reflector 300 or 400) of the dark channel. The dark channel may capture the portions by in-scattering the portions or by evanescently coupling the portions. Creating the null light intensity in the dark channel causes the output beams to coherently couple at the ends (e.g., end 115, 215, 515, 615, 715, 815, 915 or 1015) of the gain channels and the end dark channel(s) (e.g., end 125, 230, 530, 630, 740, 840, 940 or 1030). The dark channel(s) may establish a self-organizing condition among the gain channels to cause in-phase coherent coupling of the output beams at the ends of the gain channels (e.g., end 115, 215, 515, 615, 715, 815, 915 or 1015) and the end(s) (e.g., end 125, 230, 530, 630, 740, 840, 940 or 1030) of the dark channel(s). The output beams emitted from the ends (e.g., end 115, 125, 215, 230, 515, 530, 615, 630, 715, 740, 815, 915, 940, 1015 or 1035) have in phase peak light intensities and may converge in a far field to create an output beam substantially having a single lobe pattern in the far field.

As discussed above, in some implementations for coherently coupling coherent waves, the gain channels (e.g., gain channels 110, 210, 510, 610, 710, 810, 910 or 1010) and the dark channel(s) (e.g., dark channel 120, 220, 520, 620, 720, 820, 920 or 1020) emit output beams that couple into adjacent gain channels or dark channel(s). Each of the gain channels emits one of the output beams from an end (e.g., end 115, 215, 515, 615, 715, 815, 915 or 1015), and each of the dark channel(s) emit one of the output beams from an end (e.g., end 125, 230, 530, 630, 740, 840, 940 or 1030).

An interferometric null is created at the end of each dark channel (e.g., dark channel 120, 220, 520, 620, 720, 820, 920 or 1020) opposing the end at which the output beam is emitted (e.g., end 125, 230, 530, 630, 740, 840, 940 or 1030). For example, the dark channel may create an interferometric null at the reflector (e.g., reflector 300 or 400) of the dark channel, created by reverse propagating output beams in the gain and dark channels. The interferometric null may be created using a reciprocity method, as is described more fully herein.

The embodiments described herein are illustrative of the present invention. As these embodiments of the present invention are described with reference to illustrations, various modifications or adaptations of the methods and/or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is to be understood that the present invention is not limited to only the embodiments illustrated.

The foregoing description includes the best mode presently contemplated for practicing the invention. The description is not to be taken in a limiting sense but is made merely for the purpose of describing the general principles of the invention. The scope of the invention should be ascertained with reference to the issued claims.

What is claimed is:

1. A dark channel array, comprising:
 a) a plurality of gain channels, each gain channel configured to emit an output beam from an output surface of the dark channel array and to have a light wave propagating therethrough;

b) a dark channel configured to emit an output beam from the output surface of the dark channel array and to have a light wave propagating in the dark channel;

c) wherein the light waves propagating in the plurality of gain channels and the dark channel are coupled together and produce an interferometric wavefront propagating along a longitudinal direction of the dark channel array, the output beams from the plurality of gain channels being coherently coupled in phase with each other; and d) wherein the propagation of the interferometric wavefront creates a null light intensity at a location in the dark channel.

2. The dark channel array of claim 1, wherein the light waves propagating in the plurality of gain channels and the dark channel are coupled together by evanescent coupling.

3. The dark channel array of claim 1, further comprising a volume grating configured to couple a portion of the output beams emitted from each gain channel to at least one adjacent channel.

4. The dark channel array of claim 3, wherein the volume grating is a holographic coupler.

5. The dark channel array of claim 4, further comprising an output coupler configured to pass a first portion of an output beam emitted from each gain channel and to reflect a second portion of the output beam emitted from each gain channel back into a respective gain channel.

6. The dark channel array of claim 5, further comprising an aperture filler configured to expand a portion of the output beam emitted from each gain channel.

7. The dark channel array of claim 1 wherein the dark channel is configured to capture a portion of the output beam from at least two of the plurality of gain channels by radiant coupling.

8. The dark channel array of claim 1, further comprising a grating and scatting centers, the scattering centers configured to scatter a portion of the output beam into the grating, the grating configured to allow radiant coupling of scattered portions of the output beam.

9. The dark channel array of claim 8, wherein the scattering centers are in the plurality of gain channels.

10. The dark channel array of claim 8, wherein the scattering centers are in the grating.

11. The dark channel array of claim 10, wherein the grating is a surface grating.

12. The dark channel array of claim 10, wherein the grating is a relief grating.

13. The dark channel array of claim 1 wherein the plurality of gain channels and the dark channel are configured in a one dimensional array.

14. The dark channel array of claim 13, wherein the dark channel is asymmetrically positioned within the one dimensional array.

15. The dark channel array of claim 1, wherein the plurality of gain channels and the dark channel are arranged in a two dimensional array.

16. The dark channel array of claim 15, wherein the plurality of gain channels comprise laser diodes.

17. The dark channel array of claim 16, wherein the dark channel comprises a laser diode.

18. The dark channel array of claim 16, wherein the plurality of gain channels and the dark channel comprise at least one of; (a) cavity surface emitting laser diodes; or (b) edge emitting laser diodes.

19. The dark channel array of claim 1, wherein the dark channel comprises at least one of: (a) an asymmetrical position within the array; (b) a different size than the plurality of gain channels; (c) a different index of refraction than the plurality of gain channels; and (d) a different propagation rate than the plurality of gain channels.

20. A dark channel array, comprising:

a) a semiconductor substrate;

b) gain channels disposed on the semiconductor substrate, each of the gain channels being configured to emit an output beam from an output surface of the dark channel array and to have a light wave propagating therethrough;

c) a dark channel configured to emit an output beam from the output surface of the dark channel array and to have a light wave propagating in the dark channel;

d) wherein the light waves propagating in the plurality of gain channels and the dark channel couple together and produce an interferometric wavefront propagating along a longitudinal direction of the dark channel array, the output beams of the gain channels being coherently coupled in phase with each other; and e) wherein the propagation of the interferometric wavefront creates a null light intensity at a location in the dark channel.

21. The dark channel array of claim 20, wherein the dark channel is further configured to cause the output beams of the gain channels to coherently couple by evanescent coupling in the dark channel.

22. The dark channel array of claim 20, wherein the dark channel is further configured to cause the output beams to coherently couple by establishing a self-organizing condition among the output beams.

23. The dark channel array of claim 20, wherein the gain channels and the dark channel are substantially parallel to each other.

24. The dark channel array of claim 20, wherein the gain channels and the dark channel are substantially coplanar.

25. The dark channel array of claim 20, wherein the dark channel is offset among the gain channels.

26. The dark channel array of claim 20, wherein the gain channels and the dark channel comprise a width, the width of each of the gain channels being about a same width, and the width of the dark channel being different from the width of each of the gain channels.

27. The dark channel array of claim 20, wherein the gain channels and the dark channel comprise a wave propagation rate, the wave propagation rate of each of the gain channels being about a same wave propagation rate, and the wave propagation rate of the dark channel being different from the propagation rate of each of the gain channels.

28. The dark channel array of claim 20, wherein the gain channels and the dark channel comprise a refraction index, the refraction index of each of the gain channels being about a same refraction index, and the refraction index of the dark channel being different from the refraction index of each of the gain channels.

29. The dark channel array of claim 20, wherein the gain channels comprise diode lasers.

30. The dark channel array of claim 29, wherein the dark channel comprises a diode laser.

31. The dark channel array of claim 30, wherein the dark channel diode laser is configured to be pumped to transparency.

32. A dark channel laser array, comprising:

a) a means for generating output beams, the means comprising gain channels for providing light waves propagating therethrough and emitting output beams from an output surface of the dark channel array;

b) a means for coherently coupling the output beams in phase comprising at least one dark channel configured to emit an output beam from the output surface of the dark channel array and to have a light wave propagating in the dark channel;

c) wherein the light waves propagating in the gain channels and the dark channel are coupled together and produce an interferometric wavefront propagating along a longitudinal direction of the dark channel array; and d) wherein the propagation of the interferometric wavefront creates a null light intensity at a location in the dark channel.

33. The dark channel laser array of claim 32, wherein the means for coherently coupling comprises evanescent coupling.

34. The dark channel laser array of claim 32, wherein the means for coherently coupling comprises radiant coupling.

35. The dark channel array of claim 5, wherein the output coupler comprises a Bragg reflector.

36. The dark channel array of claim 6 wherein the aperture filler is located over the volume grating.

37. The dark channel array of claim 19, wherein the dark channel has an asymmetrical position within the dark channel array.

38. The dark channel array of claim 19, wherein the dark channel has a different size that the plurality of gain channels.

39. The dark channel array of claim 19, wherein the dark channel has a different index of refraction than the plurality of gain channels.

40. The dark channel array of claim 19, wherein the dark channel has a different propagation rate than the plurality of gain channels.

41. The dark channel array of claim 1, wherein the null light intensity is created at a reflector at an end of the dark channel opposite the output surface of the dark channel array.

42. The dark channel array of claim 41, wherein the null light intensity is created only at the reflector end.

43. The dark channel array of claim 1, wherein the null light intensity is created at a location other than at an end of the dark channel opposite the output surface of the dark channel array.

44. The dark channel array of claim 1, wherein the dark channel is pumped to transparency.

45. The dark channel array of claim 1, wherein the dark channel is configured to provide less gain than each of the plurality of gain channels.

46. The dark channel array of claim 1, wherein each gain channel comprises a reflector at an end opposite the output surface, and wherein the dark channel array dark channel comprises a partial reflector at an end of the dark channel opposite the output surface of the dark channel array.

47. The dark channel array of claim 1, wherein each gain channel comprises a reflective surface at an end opposite the output surface, and wherein the dark channel comprises no reflective surface at an end of the dark channel opposite the output surface of the dark channel array.

48. The dark channel array of claim 30, wherein the diode laser of the dark channel comprises at least a portion having a less active portion than the diode lasers of the gain channels.

49. The dark channel array of claim 48, wherein the diode laser of the dark channel comprises an inactive portion.

50. The dark channel array of claim 49, wherein at least a portion of the null light intensity in the dark channel corresponds with at least some of the inactive portion.

51. The dark channel array of claim 1, wherein the output beam of the dark channel is coherently coupled and in phase with the output beam of each gain channel.

52. The dark channel array of claim 20, wherein the output beam of the dark channel is coherently coupled and in phase with the output beam of gain channels.

* * * * *

UNITED STATES PATENT AND TRADEMARK OFFICE
CERTIFICATE OF CORRECTION

PATENT NO. : 7,532,392 B1 Page 1 of 1
APPLICATION NO. : 11/392140
DATED : May 12, 2009
INVENTOR(S) : Monica L. Minden et al.

It is certified that error appears in the above-identified patent and that said Letters Patent is hereby corrected as shown below:

Col. 1, line 19 should read:

--STATEMENT REGARDING FEDERALLY SPONSORED RESEARCH OR DEVELOPMENT

This invention was made with government contract support under Contract No. 3MDA972-02-C-0050, awarded by DARPA. The government has certain rights in this invention.--

Signed and Sealed this

Twelfth Day of January, 2010

David J. Kappos
*Director of the United States Patent and Trademark Office*